United States Patent
Miyauchi et al.

(10) Patent No.: US 8,040,641 B2
(45) Date of Patent: Oct. 18, 2011

(54) MAGNETO-RESISTANCE EFFECT ELEMENT WITH A STACKED BODY HAVING A CONSTRICTED SHAPE

(75) Inventors: Daisuke Miyauchi, Tokyo (JP); Kazuki Sato, Tokyo (JP); Takayasu Kanaya, Tokyo (JP); Takahiko Machita, Tokyo (JP)

(73) Assignee: TDK Corporation, Tokyo (JP)

( * ) Notice: Subject to any disclaimer, the term of this patent is extended or adjusted under 35 U.S.C. 154(b) by 1230 days.

(21) Appl. No.: 11/783,098

(22) Filed: Apr. 5, 2007

(65) Prior Publication Data
US 2007/0279809 A1    Dec. 6, 2007

(30) Foreign Application Priority Data
Jun. 6, 2006   (JP) .................... 2006-157106

(51) Int. Cl.
*G11B 5/39* (2006.01)
(52) U.S. Cl. .................................... 360/324.1
(58) Field of Classification Search ............. 360/324, 360/324.1, 324.12, 313
See application file for complete search history.

(56) References Cited

U.S. PATENT DOCUMENTS
6,937,446 B2   8/2005   Kamiguchi et al.
7,046,489 B2   5/2006   Kamiguchi et al.
2002/0036876 A1*   3/2002   Kawawake et al. ........ 360/324.1
2005/0094317 A1   5/2005   Funayama FOREIGN PATENT DOCUMENTS
JP   2002-176211   6/2002
JP   2002-208744   7/2002
JP   2003-204094   7/2003
JP   2005-136309   5/2005

OTHER PUBLICATIONS

Covington, M. et al., "Current-induced magnetization dynamics in current perpendicular to the plane spin valves," The American Physical Society, Physical Review B. 69, pp. 184406-1-184406-8, 2004.
Nakamura, S., "Current Driven Magnetic Switching for Magnetic Memory Materials," (Corporate R&D Center, Toshiba Corporatino, Kawaski), pp. 499-503, 2004.

* cited by examiner

*Primary Examiner* — Mohammad Ghayour
*Assistant Examiner* — Tamara Ashford
(74) *Attorney, Agent, or Firm* — Oliff & Berridge, PLC (57) ABSTRACT

A magneto-resistance effect element comprises a stacked body which comprises a pinned layer having a fixed magnetization direction, a free layer having a magnetization direction that varies according to an external magnetic field, and a nonmagnetic spacer layer which is interposed between the pinned layer and the free layer. The stacked body having a constricted shape in which at least one part of the spacer layer is constricted when viewed from at least one direction perpendicular to a stacked direction of the stacked body.

13 Claims, 6 Drawing Sheets

FIG. 1

CONVENTIONAL ART

MAGNETO-RESISTANCE EFFECT ELEMENT WITH A STACKED BODY HAVING A CONSTRICTED SHAPE

This Application is a U.S. Utility patent application which claims foreign priority from Japanese Application No. 2006-157106, filed Jun. 6, 2006, the complete disclosure of which is incorporated herein by reference.

BACKGROUND OF THE INVENTION

1. Field of the Invention

The present invention relates to a magneto-resistance effect element and a thin-film magnetic head which are suitably used for a hard-disk drive, and to a method for manufacturing the magneto-resistance effect element.

2. Description of the Related Art

A hard-disk drive uses a thin-film magnetic head having a magneto-resistance effect element (MR element) to read out a magnetic signal. In recent years, the trend is for hard-disk drives to have higher recording densities. Correspondingly, the magneto-resistance effect element in a thin-film magnetic head is required to have, in particular, higher sensitivity and higher output.

A CIP-GMR (Current in Plane-Giant Magneto-resistance) element which is a giant magneto-resistance effect element having a nonmagnetic layer between ferromagnetic layers and passing a sensing current in parallel to a layer surface, has been conventionally developed as a reproducing element in a thin-film magnetic head. On the other hand, a magnetic head that uses a TMR (Tunnel Magneto-resistance) element which has an insulation layer instead of the nonmagnetic layer as an intermediate layer and which passes a sensing current perpendicular to a layer surface, has also been developed in order to achieve higher densification. Furthermore, a magnetic head that uses a CPP (Current Perpendicular to Plane)-GMR element which is a GMR element having a nonmagnetic layer as the intermediate layer and passing a sensing current perpendicular to the layer surface similar to the TMR element, has also been developed. CPP-GMR element has an advantage of having low resistance in comparison with the TMR element and higher output in a narrower track width than the CIP-GMR element.

Figure 1:
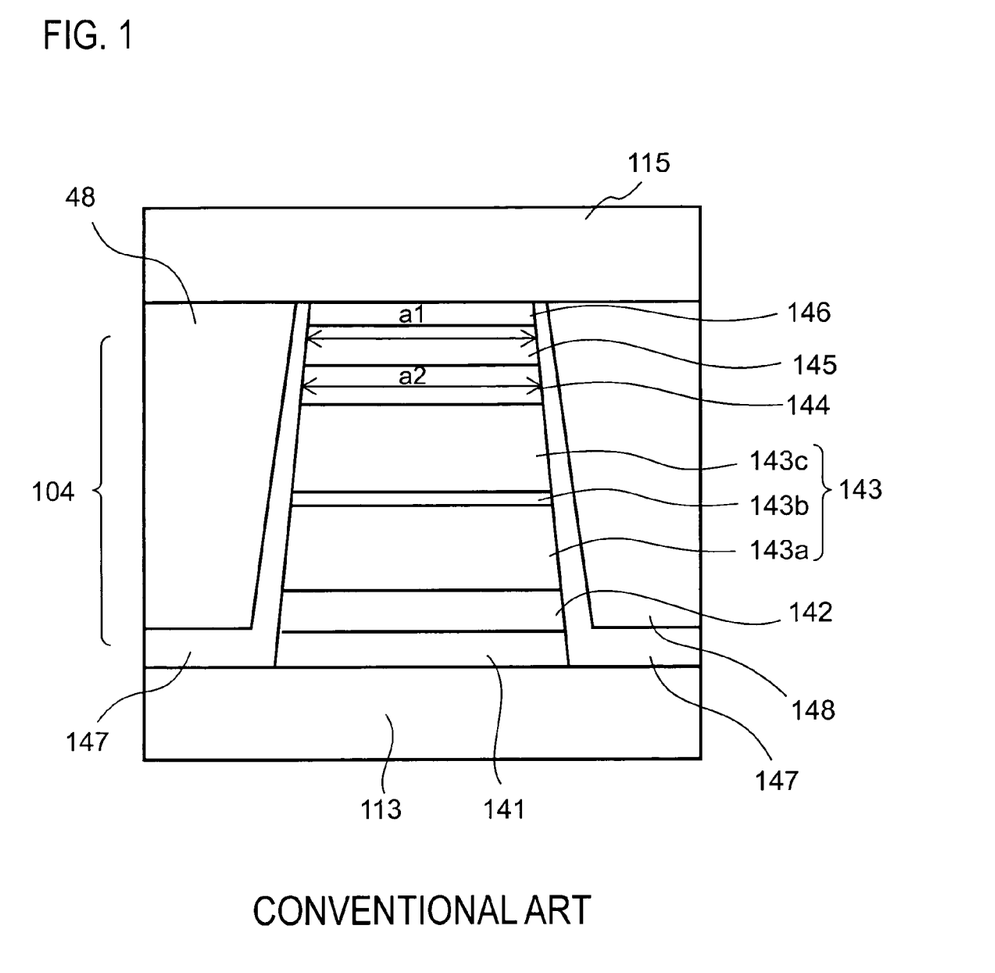
FIG. 1 shows a surface of a conventional MR element to face a recording medium.

FIG. 1 shows a structure of the conventional CPP-GMR element. CPP-GMR element 104 is interposed between lower shield layer 113 and upper shield layer 115, each of which serves as an electrode film as well, and is also referred to as a spin valve film (SV film). CPP-GMR element 104 has a pillar shape having a desired size, and has a structure in which nonmagnetic spacer layer 144 is interposed between pinned layer 143 that is a ferromagnetic layer in which the magnetization direction is fixed and free layer 145 that is a ferromagnetic layer in which the magnetization direction varies according to an external magnetic field. The magnetization direction in the pinned layer 143 is fixed because pinned layer 143 is arranged on antiferromagnetic layer 142 arranged thereon. Recently, pinned layer 143 can be not only made into a single-layered structure of a ferromagnetic material but can also be made into a three-layer structure (synthetic pinned layer) formed of a ferromagnetic layer that is inner layer 143*c*, a nonmagnetic metal layer that is nonmagnetic intermediate layer 143*b*, and a ferromagnetic layer that is outer layer 143*a*. Thus configured, CPP-GMR element 104 provides a strong exchange coupling between two ferromagnetic layers 143*a* and 143*c*, and thus effectively increases the power of exchange coupling with antiferromagnetic layer 142. Hard magnetic film (hard bias film) 148 made from CoPt or CoCrPt is arranged around CPP-GMR element 104 through insulation film 147 such as $Al_2O_3$. Hard bias film 148 is a film for controlling the magnetic domain of free layer 145, and is located on the side of CPP-GMR element 104 in the track width direction. Cap layer 146 and buffer layer 141 are respectively arranged on the top end and the bottom end of CPP-GMR element 104. Cap layer 146, CPP-GMR element 104, and buffer layer 141 are interposed between upper shield layer 115 and lower shield layer 113.

Feature of low resistance of a CPP-GMR element is very advantageous for frequency characteristics, but causes a defect that resistance change is low. This is because when the absolute value of resistance is small, the amount of resistance change is generally small as well. The magneto-resistance effect element having a small amount of the resistance change shows low sensitivity when used as a reproducing element in a thin-film magnetic head.

For this reason, a known CPP-GMR element uses the technology of CCP (Confined Current Path) to increase the resistance value by restricting electric current.

Japanese Patent Application Laid-Open No. 2002-208744 describes a configuration in which a resistance adjustment layer is arranged on at least one of a pinned layer, a spacer layer, and a free layer. For instance, the resistance adjustment layer which is made from a metalloid or a zero-gap semiconductor and which has a pinhole therein, is inserted into each of the layers. In the configuration, an electric current that flows in a direction perpendicular to a layer surface is interrupted by the resistance adjustment layer, and only flows through the pinhole in the resistance adjustment layer. Japanese Patent Application Laid-Open No. 2003-204094 proposes a configuration in which a magnetic metal and an insulative material are distributed on a boundary surface of the spacer layer. The magnetic metal and the insulative material interrupt the electric current flowing in a direction perpendicular to the layer surface. Accordingly, the electric current only passes through gaps which lack magnetic metal and insulative material. As thus described above, in the configurations of Japanese Patent Application Laid-Open No. 2002-208744 and Japanese Patent Application Laid-Open No. 2003-204094, electric current flowing in the direction perpendicular to the layer surface only passes through specific parts (that are pinholes or gaps) inside the spacer layer. In other words, the spacer layer has a function of restricting electric current by confining the path for the electric current to pass, and consequently increases the resistance value.

In addition, Japanese Patent Application Laid-Open No. 2005-136309 proposes a configuration in which a spacer layer is partially irradiated with an Ar ion beam and then the spacer layer is oxidized. As a result, a region which has been previously irradiated with the Ar ion beam, becomes a current control region for passing an electric current in a direction perpendicular to a layer surface. The region which has not been previously irradiated with the Ar ion beam becomes an insulator region for interrupting the electric current in the direction perpendicular to the layer surface. In the configuration described in Japanese Patent Application Laid-Open No. 2002-176211, a stacked body of a pinned layer, a spacer layer, and a free layer are partially oxidized from the side of the stacked body. As a result, there exists an oxidized region for interrupting the electric current in the direction perpendicular to a layer surface, in both sides of each layer; and there remains a non-oxidized region for passing the electric current in the direction perpendicular to the layer surface, in the central part of each layer. Thus, in the configurations of Japanese Patent Application Laid-Open No. 2005-136309 and Japanese Patent Application Laid-Open No. 2002-176211 as well, the electric current in the direction perpendicular to the layer surface only passes through a specific part (that is current control region or non-oxidized region) inside the spacer layer. In other words, the spacer layer has a function of restricting the electric current by confining the path for the electric current to pass, and consequently increases a resistance value.

As described above, in configurations according to the above described four patent documents, a spacer layer increases a resistance value by the function of confining electric current, and thereby increases the amount of resistance change.

In a CCP-CPP-GMR element, an electric current value in a direction perpendicular to a layer surface varies, in other words, a resistance value varies according to the size of a current confining part. The amount of resistance change is dependent on the change of the electric current, and furthermore, the sensitivity of the magneto-resistance effect element is also dependent on the change of the electric current. Accordingly, in order to obtain a magneto-resistance effect element having the desired sensitivity, the current confining part needs to be formed with high accuracy.

In a configuration described in Japanese Application Patent Laid-Open No. 2002-208744 among the above described conventional CCP-CPP-GMR elements, a resistance adjustment layer of an aluminum oxide layer having pinholes is formed, for example, by the steps of forming an aluminum layer and exposing the aluminum layer to an oxygen atmosphere to make self oxidation. The resistance adjustment layer can also be formed by another method comprising the steps of forming one or more copper pillars on a copper layer that makes up the spacer layer; and filling a perimeter of the pillar with an insulation material (oxide, for instance). The resistance adjustment layer can also be formed by still another method comprising the steps of forming an insulative layer that has previously opened pinholes on the copper layer that makes up the spacer layer. However, it is very difficult to form a resistance adjustment layer having pinholes with the appropriate number and size uniformly distributed therein by these methods.

In addition, in Japanese Patent Application Laid-Open No. 2003-204094, the configuration is formed, for instance, by the steps of preparing a copper layer as a spacer layer, forming a magnetic metal film by sputtering, and introducing oxygen gas, so that an insulative material which makes up oxidized parts and a magnetic metal which makes up unoxidized parts are distributed in a mixed state. In this method, it is difficult to precisely and uniformly distribute the oxidized parts of the insulative material, and to precisely and uniformly distribute the unoxidized parts of magnetic metal without being oxidized, in the magnetic metal film at an appropriate ratio.

In a configuration described in Japanese Patent Application Laid-Open No. 2005-136309, it is necessary to irradiate Ar ion beam with high accuracy, and to completely oxidize a part which has not been irradiated with the Ar ion beam. When the Ar ion beam has been irradiated with low accuracy, or when the part which has not been irradiated with the Ar ion beam remains insufficiently oxidized, a current confining part can not be formed with high accuracy, and the obtained magneto-resistance effect element does not show the desired sensitivity.

In the configuration described in Japanese Patent Application Laid-Open No. 2002-176211, when a SV film is oxidized (or nitrided or oxynitrided) up to an inaccurate depth from the side of the SV film, a current confining part can not be formed with high accuracy, and the resulting magneto-resistance effect element does not show the desired sensitivity.

A recent magneto-resistance effect element is so small that the length of one side is about several tens of nanometers. Accordingly, it is difficult to form a highly precise current confining part inside a spacer layer of the magneto-resistance effect element by the methods described in the above four patent documents. In other words, it is very difficult to form extremely fine pinholes with high accuracy based on the method of Japanese Patent Application Laid-Open No. 2002-208744, to oxidize a magnetic metal film at an appropriate ratio based on the method of Japanese Patent Application Laid-Open No. 2003-204094, to precisely irradiate an ion beam and completely oxidize an unirradiated part based on the method of Japanese Patent Application Laid-Open No. 2005-136309, and to precisely oxidize (or nitride or oxynitride) an SV film from the side of the SV film by the desired depth based on the method of Japanese Patent Application Laid-Open No. 2002-176211. Accordingly, it is actually difficult to obtain the desired current confining effect and the desired sensitivity in an extremely fine magneto-resistance effect element by the four methods. Besides, in the configurations described in those patent documents, an unprecedented, special, and complicated step must be done for the purpose of forming the current confining part. As a result, the manufacturing cost increase.

SUMMARY OF THE INVENTION

An object of the present invention is to provide a magneto-resistance effect element which possesses the desired characteristic and which can be inexpensively and easily manufactured without adding a complicated step, to provide a method for manufacturing such a magneto-resistance effect element, and to provide a thin-film magnetic head comprising such a magneto-resistance effect element.

A magneto-resistance effect element according to the present invention comprises a stacked body which comprises a pinned layer having a fixed magnetization direction, a free layer having a magnetization direction that varies according to an external magnetic field, and a nonmagnetic spacer layer which is interposed between the pinned layer and the free layer, and the stacked body has a constricted shape in which at least one part of the spacer layer is constricted when viewed from at least one direction perpendicular to a stacked direction of the stacked body. The spacer layer may be constricted with respect to the pinned layer and the free layer. The spacer layer may be formed into a constricted shape centered in the narrowest portion when viewed from the direction perpendicular to the stacked direction. Both the pinned layer and the free layer have widths which vary when viewed from at least one direction perpendicular to a stacked direction of the stacked body, and the widths of both the pinned layer and the free layer are smallest at the interface with the spacer layer when viewed from the direction perpendicular to the stacked direction.

A magneto-resistance effect element with such a configuration can acquire an increased amount of resistance change concurrently with being miniaturized, and besides, can be easily manufactured.

The smallest width of the spacer layer is smaller than the smallest width of the pinned layer and smaller than the smallest width of the free layer when viewed from the direction perpendicular to the stacked direction. Preferably, the largest width of the free layer is 1.33 or more times larger than the smallest width of the spacer layer when viewed from the direction perpendicular to the stacked direction. Preferably, the largest width of the free layer is 60 nm or less when viewed from the direction perpendicular to the stacked direction.

The smallest cross-section area of the spacer layer is smaller than the smallest cross-section area of the pinned layer and smaller than the smallest cross-section area of the free layer when viewed from the stacked direction. Preferably, the largest cross-section area of the free layer is 1.77 or more times larger than the smallest cross-section area of the spacer layer when viewed from the stacked direction.

Further, it is preferable that area A1 and area A2 satisfies the relationship, $A1/A2 \geq$ applied voltage$/(7 \times 10^7 [A/cm^2] \times$ sheet resistance), where A1 is the largest cross-section area of the free layer when viewed from the stacked direction, and A2 is the smallest cross-section area of the spacer layer when viewed from the stacked direction.

A magneto-resistance effect element having the above described configuration inhibits the fluctuation of magnetization or magnetization reversal from occurring in the free layer due to spin torque, and can show high accuracy when actually used.

A method for manufacturing a magneto-resistance effect element according to the present invention, having a stacked body which includes a pinned layer having a fixed magnetization direction, a free layer having a magnetization direction that varies according to an external magnetic field, and a nonmagnetic spacer layer which is interposed between the pinned layer and the free layer, comprises: a step of forming the stacked body; a first milling step of milling a side of the stacked body; and a second milling step of milling the side of the stacked body again at a different milling angle from that in the first milling step. The second milling step is carried out so that a constricted shape at, at least, one part of the spacer layer is formed, or carried out so that both the pinned layer and the free layer have widths which vary and the widths of both the pinned layer and the free layer are smallest at the interface with the spacer layer when viewed from at least one direction perpendicular to a stacked direction of the stacked body.

Preferably, the stacked body is subjected to milling at an angle between zero degrees and 15 degrees with respect to the stacked direction in the first milling step, and the side of the stacked body is subjected to milling at an angle of 60 degrees or more with respect to the stacked direction in the second milling step.

The above methods can easily and efficiently manufacture a magneto-resistance effect element that will have a large amount of resistance change although the size of the element is small.

Thus, the present invention can provide a magneto-resistance effect element which is miniaturized, has a large amount of resistance change, can be easily manufactured, and further can inhibit the harmful effect caused by spin torque.

The above and other objects, features and advantages of the present invention will become apparent from the following description with reference to the accompanying drawings which illustrate examples of the present invention.

DETAILED DESCRIPTIONS OF THE PREFERRED EMBODIMENTS

Next, embodiments according to the present invention will be described with reference to the drawings.

[Configuration of Thin-film Magnetic Head]

Figure 2:
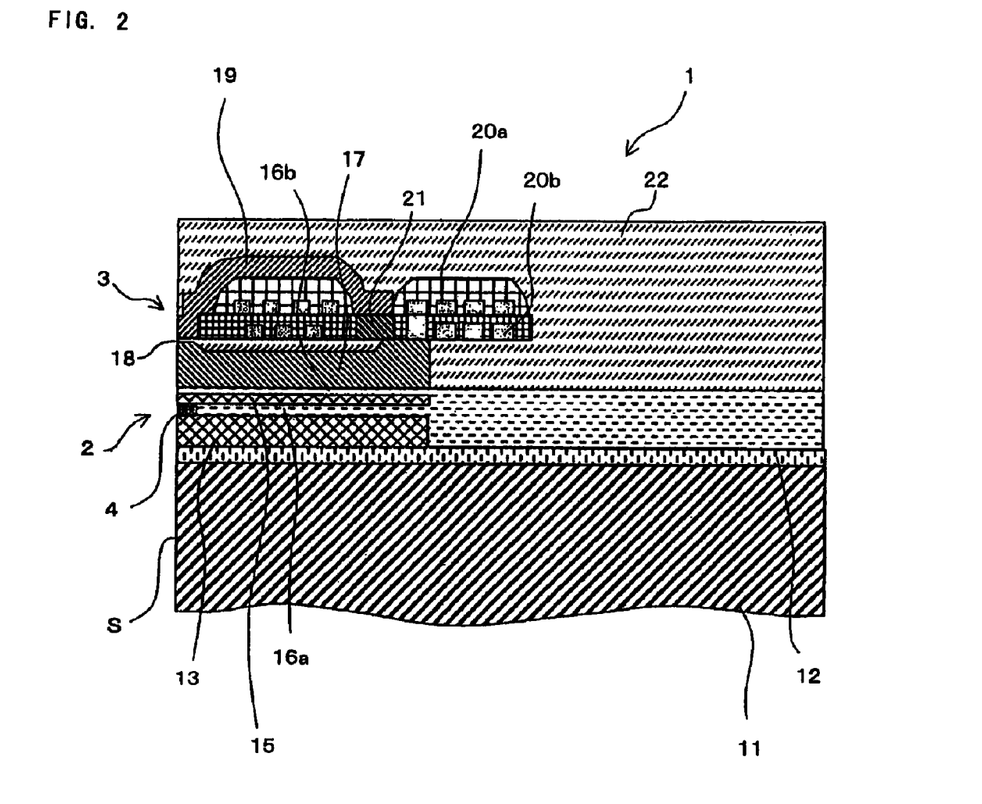
FIG. 2 is a sectional view of a main part of a thin-film magnetic head according to one embodiment of the present invention.

FIG. 2 conceptually shows a sectional view of the main part of a thin-film magnetic head according to one embodiment of the present invention.

Thin-film magnetic head 1 according to the present embodiment has substrate 11, reproducing section 2 which reads out data from a recording medium (not shown) and which is formed on substrate 11, and recording section 3 for writing data on a recording medium (not shown) and which is formed on substrate 11.

Substrate 11 is made from Al$_2$O$_3$/TiC (Altic) which is superior in abrasion resistance. Substrate 11 has underlayer 12 made from alumina which is formed on the top surface of substrate 11, and reproducing section 2 and recording section 3 are stacked further thereon.

Lower shield layer 13 made from a magnetic material such as Permalloy (NiFe) is formed on underlayer 12. A CPP-GMR element 4 (hereafter, referred to as only "MR element") which is a magneto-resistance effect element is formed on an end part of lower shield layer 13 on the side of a surface (S) to face a recording medium. One end of MR element 4 is exposed at surface (S). First upper shield layer 15 made from a magnetic material such as Permalloy is formed on MR element 4. Reproducing section 2 is composed of lower shield layer 13, MR element 4, and first upper shield layer 15. Insulation layer 16a is mainly formed on a part having no MR element 4 in between lower shield layer 13 and first upper shield layer 15. MR element 4 is also referred to as an SV film (spin valve film).

Insulation layer 16b is formed on first upper shield layer 15, and lower magnetic pole layer 17 made from a magnetic material such as Permalloy and CoNiFe is further formed thereon. Lower magnetic pole layer 17 has a function as the lower magnetic pole layer of recording section 3 and a function as the second upper shield layer for MR element 4.

Recording gap layer 18 made from a nonmagnetic material such as Ru and alumina is formed on lower magnetic pole layer 17 which functions as the second upper shield layer, and upper magnetic pole layer 19 is further formed thereon. Recording gap layer 18 is formed at an end on the side of surface (S) to face a recording medium. One end of recording gap layer 18 is exposed at surface (S) to face a recording medium. As a material for upper magnetic pole layer 19, a magnetic material such as Permalloy and CoNiFe is used. Lower magnetic pole layer (second upper shield layer) 17 and upper magnetic pole layer 19 are magnetically connected by connecting part 21 to form one magnetic circuit as a whole.

Double-layer coils 20a and 20b made from a conductive material such as copper are formed between lower magnetic pole layer 17 and upper magnetic pole layer 19 and between (S) to face a recording medium and connecting part 21. Respective coils 20a and 20b supply a magnetic flux respectively to lower magnetic pole layer 17 and upper magnetic pole layer 19. Respective coils 20a and 20b are formed so that the respective planar shapes become the spiral shapes around connecting part 21. Coils 20a and 20b are insulated from a peripheral part by an insulation layer. In the present embodiment, double-layer coils 20a and 20b are shown. However, the coil is not limited to the double-layer construction, and it may be a single-layer construction, a triple-layer construction, or more layer construction.

Overcoat layer 22 is formed so as to cover upper magnetic pole layer 19, and protects the above described structure. As a material for overcoat layer 22, an insulation material such as alumina is used.

[Configuration of MR Element]

Next, MR element (SV film) 4 will be described in detail with reference to FIG. 3 which is a drawing viewed from a side of surface (S) to face a recording medium.

MR element 4 is formed so as to be interposed between lower shield layer 13 and upper shield layer 15, as described above. MR element 4 has a configuration in which buffer layer 41, antiferromagnetic layer 42, pinned layer 43, spacer layer 44, free layer 45, and cap layer 46 are stacked in this order from lower shield layer 13 side. In an example shown in FIG. 3, pinned layer 43 has a configuration in which nonmagnetic intermediate layer 43b is interposed between outer layer 43a and inner layer 43c each made from a ferromagnetic material. Such pinned layer 43 is referred to as a synthetic pinned layer. Outer layer 43a is provided so as to make contact with antiferromagnetic layer 42, and inner layer 43c is provided so as to make contact with spacer layer 44. One example of materials and thicknesses of the respective layers is shown in Table 1. As for the description of "Co90Fe10" or the like in Table 1, the digit means atomic fractions for respective components by percentage, and accordingly, for instance, "Co90Fe10" means a layer in which Co shares 90% and Fe shares 10%.

TABLE 1

| | | material | thickness(nm) |
|---|---|---|---|
| | cap layer | Ru | 10.0 |
| | free layer | Co90Fe10 | 5.0 |
| | spacer layer | Cu | 3.0 |
| pinned | inner layer | Co50Fe50 | 4.5 |
| layer | nonmagnetic intermediate layer | Ru | 0.8 |
| | outer layer | Co70Fe30 | 4.0 |
| | antiferromagnetic layer | IrMn | 7.0 |
| | bufferlayer | NiFeCr | 5.0 |
| | | Ta | 1.0 |

Lower shield layer 13 and upper shield layer 15 serve as electrodes as well. A sensing current flows between lower shield layer 13 and upper shield layer 15 through MR element 4, in a direction perpendicular to a layer surface.

As a material for buffer layer 41, a combination is selected in which antiferromagnetic layer 42 and outer layer 43a of pinned layer 43 are adequately exchange-coupled. For instance, buffer layer 41 is composed of a stacked film such as Ta/NiFeCr which is shown in Table 1, Ta/NiCr, Ta/Ru, and Ta/NiFe. Antiferromagnetic layer 42 plays a role in fixing a magnetization direction in pinned layer 43. Antiferromagnetic layer 42 is made from IrMn, PtMn, RuRnMn, or NiMn, for example. In addition, the mark "/" to show the multilayer film structure used in the present specification means that the material on the left side of "/" is a lower layer than the material on the right side, namely, the material on the left side of "/" is an earlier formed layer than the material on the right side.

Pinned layer 43 is formed as a magnetic layer, and has a configuration in which outer layer 43a, nonmagnetic intermediate layer 43b, and inner layer 43c are stacked in this order, as described above. The magnetization direction in outer layer 43a is not affected by an external magnetic field but is fixed by antiferromagnetic layer 42. Outer layer 43a is made from CoFe which is shown in Table 1, or is composed of a stacked film made of CoFe/FeCo/CoFe, for instance. Nonmagnetic intermediate layer 43b is made from Ru, for example. Inner layer 43c is made from CoFe, for instance, which is generally used as a ferromagnetic layer. In such a synthetic pinned layer, the magnetic moments of outer layer 43a and inner layer 43c cancel each other out. Accordingly, the synthetic pinned layer inhibits a magnetic flux from leaking out as a whole, and also strongly fixes the magnetization direction in inner layer 43c.

Spacer layer 44 is made from a nonmagnetic material. A usable material for spacer layer 44 includes Cu, Au, and Ag.

The magnetization direction in free layer 45 varies according to the external magnetic field. Free layer 45 is made from a magnetic material such as CoFe and NiFe. Free layer 45 may be a multilayered structure. In that case, free layer 45 may have a layer made from CoFe, for instance, on the side of spacer layer 44.

Cap layer 46 is arranged for preventing MR element 4 from deteriorating, and is made from Ru, for instance.

Insulation film 47 is arranged on both sides (both the right and left sides in FIG. 3) of MR element 4 in a track width direction (the in-plane direction of each layer that makes up MR element 4 in a plane parallel to surface (S) to face a recording medium [see FIG. 2]), and hard bias film 48 is arranged further thereon. Hard bias film 48 makes free layer 45 be a single magnetic domain by applying the bias magnetic field in the track width direction to free layer 45. A usable material for hard bias film 48 includes hard magnetic materials such as CoPt and CoCrPt. The purpose of insulation film 47 is to prevent sensing current from leaking to hard bias film 48. Insulation film 47 can be formed from an oxide film such as $Al_2O_3$. Insulation film 47 may be one part of insulation layer 16a.

Next, the most characteristic configuration in the present embodiment will be described. The most characteristic configuration in the present embodiment is that MR element 4 has a constricted shape at spacer layer 44 when viewed from a side of surface (S) to face a recording medium (a direction perpendicular to a stacked direction). In other words, pinned layer 43 is formed into an approximate trapezoidal shape, and free layer 45 is formed into an approximate inverse trapezoidal shape. The widths of both pinned layer 43 and free layer 45 are smallest at the interface with spacer layer 44. Spacer layer 44 has a width which is equal to or smaller than the smallest widths of pinned layer 43 and smaller than the smallest widths of free layer 45. At least the smallest width of spacer layer 44 is smaller than the smallest widths of pinned layer 43 and smaller than the smallest widths of free layer 45.

[Discussion on Shape of MR Element]

It will be now described how technologically significant is the constricted shape formed at spacer layer 44 in MR element 4 as described above.

Value (dR)/(R) and value (RA) are generally used as an indicator showing the characteristics of a CPP-GMR element and a TMR element. Value (dR)/(R) is obtained by dividing the amount (dR) of resistance change by resistance, and has no unit. In general, the larger the value (dR)/(R), the higher is the sensitivity of the MR element. Value (RA) means sheet resistance, namely, a product of the resistance and the area, and is expressed by the unit of $\Omega\mu m^2$.

Resistance (R) which means resistance in the entire MR element 4, is the sum of resistance in all the layers from cap layer 46 to buffer layer 41, and is determined by the part having the smallest area among parts through which an electric current passes. In the respective layers of MR element 4, there are layers that hardly affect the amount (dR) of the resistance change, namely, there are layers which do not contribute to the resistance change. Specifically, cap layer 46, antiferromagnetic layer 42, and buffer layer 41 do not contribute to the resistance change. The layers which cause the resistance change are free layer 45, spacer layer 44, and pinned layer 43. Accordingly, an increase of the resistance values of free layer 45, spacer layer 44, and pinned layer 43 results in an increase in the amount of the resistance change as well as an increase in resistance (R). On the other hand, the increase in resistance of cap layer 46, antiferromagnetic layer 42, and buffer layer 41 results in an increase in resistance (R), but does not change the amount (dR) of resistance change, and consequently results in a decrease of value (dR)/(R), which is unfavorable.

Next, the resistance value will be considered. The resistance value generally increases along with a decrease of the area of a part through which an electric current passes. In the conventional configuration shown in FIG. 1, MR element 104 is trapezoidal, and the area of layers gradually increases in the order of cap layer 146, free layer 145, spacer layer 144, pinned layer 143 (inner layer 143c, nonmagnetic intermediate layer 143b, and outer layer 143a), antiferromagnetic layer 142, and buffer layer 141. Among them, antiferromagnetic layer 142 and buffer layer 141 do not have high resistance because they have large areas, whereas cap layer 146 has the smallest area and the high resistance. As described above, cap layer 146 does not contribute to a resistance change. Accordingly, it is not preferable that cap layer 146 is formed into a layer that has the smallest area in MR element 104 and has high resistance because the value (dR)/(R) becomes small.

Figure 3:
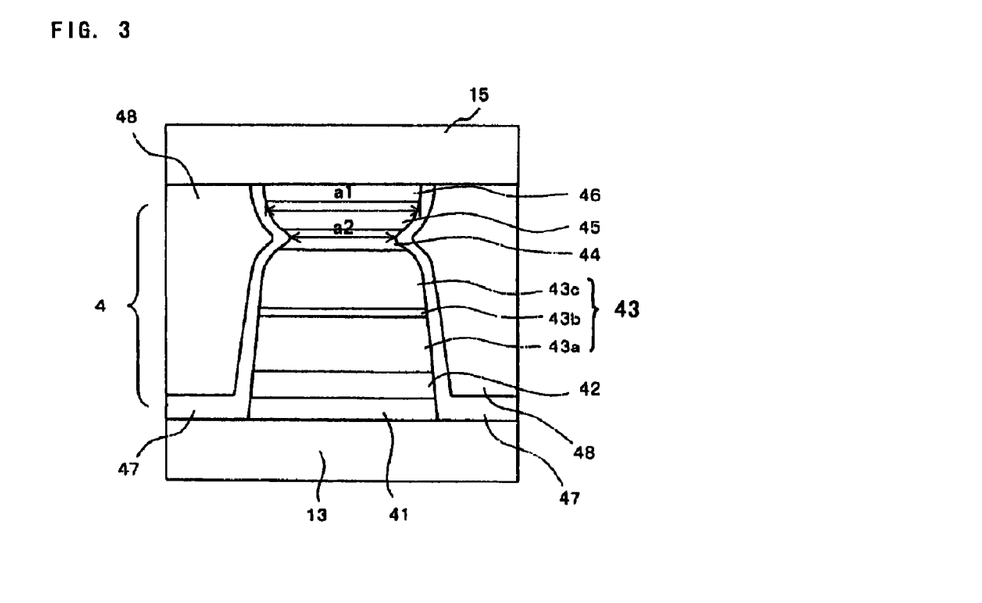
FIG. 3 shows a surface of the MR element to face a recording medium shown in FIG. 2.

In the present embodiment as shown in FIG. 3, MR element 4 causes constricted spacer layer 44 to have the smallest area. When the area of spacer layer 44 is small, resistance (R) increases, but the amount (dR) of resistance change also increases. As a result, the value (dR)/(R) of MR element 4 does not decrease but rather possibly increases. As described above, when MR element 4 has a constricted shape at spacer layer 44, it acquires a larger value of (dR)/(R) and a higher sensitivity than a conventional MR element that has a configuration in which cap layer 146 has the smallest area.

This point will be now described referring to a specific example.

In many cases, the value (RA) that indicates the characteristics of MR element 4 is calculated by using an area observed from the top surface of MR element 4 (from the upper part in a stacked direction). The reason will now be described below. On the uppermost face of the MR element, ordinarily a cap layer is formed, and the side of the MR element tilts at a certain angle. Conventionally, cap layer 146 has the smallest area in MR element 104 (see FIG. 1). As described above, resistance (R) is determined by the part having the smallest area among parts through which an electric current passes. However, the part having the smallest area in MR element 4 is spacer layer 44 in the present invention, because MR element 4 is formed so as to have a constricted shape at spacer layer 44. Accordingly, it is appropriate in the case of the present invention to calculate value (RA) by using the area of spacer layer 44. Then, MR element 4 according to the present invention will be compared to conventional MR element 104 (see. FIG. 1) which has a conventional and ordinary structure and which does not have a constricted shape at spacer layer 144.

Value (RA) of CPP-GMR elements is generally about 0.08 $\Omega\mu m^2$, and is approximately constant. When conventional CPP-GMR element 104 has a planar area, namely, an area of uppermost cap layer 146 in an amount of 55 nm×55 nm (0.055 $\mu m \times 0.055$ $\mu m$)=about 0.0030 $\mu m^2$, resistance (R) of conventional CPP-GMR element 104 is about 26.4Ω.

In contrast to this, CPP-GMR element 4 in the present embodiment has resistance (R) of 0.08/0.0016=50Ω when the area of a constricted part in spacer layer 44 is 40 nm×40 nm (0.04 $\mu m \times 0.04$ $\mu m$)=0.0016 $\mu m^2$, though the area of cap layer 46 is 55 nm×55 nm=about 0.0030 $\mu m^2$ which is the same value to the case of a conventional CPP-GMR element.

A constant voltage is applied to conventional MR element 104 and MR element 4 according to the present embodiment. As described above, MR element 4 according to the present embodiment has resistance (R) of about 1.9 times that of the conventional MR element, and consequently an electric current passing through MR element 4 is about 1/1.9 times that passing through the conventional MR element. On the other hand, an area of a constricted part in spacer layer 44 of MR element 4 according to the present embodiment is about 1/1.9 times the area of cap layer 146 in conventional MR element 104. Thus, the ratio of both currents is equal to the ratio of both areas, so that both current densities become approximately equal.

However, as described above, cap layers 46 and 146 do not contribute to resistance change. In other words, the resistance of cap layers 46 and 146 is so-called parasitic resistance. Accordingly, it is assumed that the characteristics of MR elements 4 and 104 can be more precisely understood by calculating the characteristics with the use of the areas of free layers 45 and 145, spacer layers 44 and 144, and pinned layers 43 and 143, which contribute to the resistance change, instead of the areas of cap layers 46 and 146. As described above, in a conventional MR element 104 in which the area of cap layer 146 is an amount of 55 nm×55 nm=about 0.0030 $\mu m^2$ and which has a tilted side, the area in the middle part of spacer layer 144 is an amount of 60 nm×60 nm (=0.06 $\mu m \times 0.06$ $\mu m$)=about 0.0036 $\mu m^2$ Then, the area of spacer layer 144 is 1.2 times that of cap layer 146, and the current density in spacer layer 144 also becomes about 1.2 times that of cap layer 146. Accordingly, in MR element 4 that has a constricted shape at spacer layer 44 and that has a small area in spacer layer 44, according to the present embodiment, current density in the layers which contribute to resistance change is higher than in the case of a conventional MR element 104. Accordingly, MR element 4 according to the present embodiment shows larger amount (dR) of resistance change than a conventional MR element 104 that does not have constricted shape at spacer layer 144.

For reference purpose, experimentally produced MR element 4 according to the present embodiment showed a resistance (R) about 1.7 times and an electric current about 1/1.7 times as high as those in a conventional MR element 104. In addition, when (dR)/(R) of the MR elements were measured at a constant voltage, MR element 4 according to the present embodiment showed a value about 1.2 times higher than the value in a conventional MR element 104, and as for (dR), MR element 4 according to the present embodiment showed a value about 1.7 times higher than the value in a conventional MR element 104.

[Discussion on Spin Torque]

Next, spin torque will be described which is a problem that has occurred in recent years with a CPP-GMR element.

When a spin-polarized electron is injected into a magnetic layer, the injected electron tries to rotate the spin in the magnetic layer in the same direction as the injected electron itself. The phenomenon of trying to rotate the spin and to change the direction of spin is referred to as spin torque (see two documents "Spin Injection Magnetization Reversal in Magnetic storage material and Mechanism", Shiho Nakamura, Bulletin of Japan Institute of Metals, "Materia Japan", Vol. 43, No. 6, 2004, pp. 498-503, and "Current-induced magnetization dynamics in current perpendicular to the plain spin valves", M. Covington et al., Physical Review B69, 184406, 2004, American Physical Society). As a result of spin torque, the magnetized state of the magnetic layer becomes unstable, and the magnetic layer occasionally causes magnetization reversal therein. Such spin torque is occasionally and effectively utilized when it is intended for magnetization reversal to occur in an MRAM. However, it is not desirable for spin torque to occur in a reproducing element in a thin-film magnetic head because the magnetization direction in a free layer may be determined by a factor other than that of the recording medium.

Specific spin torque in a CPP-GMR element will be now described. As described above, when an electric current flows through MR element 4, which has pinned layer 43, spacer layer 44, and free layer 45 stacked therein, so that the electron flows from pinned layer 43 to free layer 45, the electron having a spin direction parallel to a magnetized direction in pinned layer 43 easily passes through pinned layer 43. However, an electron having a spin direction anti-parallel to the magnetized direction of pinned layer 43 can not pass though pinned layer 43, and is reflected back. In other words, pinned layer 43 acts as a spin filter. As a result, only the electrons having a spin direction parallel to the magnetized direction of pinned layer 43 flow into spacer layer 44. Thus, the electrons in a spin-polarized state pass though spacer layer 44 and are injected into free layer 45. When the electrons in the spin-polarized state are injected into free layer 45 in which the magnetization direction is not fixed, the spin torque acts in free layer 45 to direct the spin in the magnetic layer of free layer 45 in the same direction as the spin direction of the injected electrons. When a large number of electrons in thus spin-polarized state are injected, the magnetization direction in free layer 45 becomes unstable, and free layer 45 occasionally causes magnetization reversal therein.

When MR element 4 is used as a reproducing element of thin-film magnetic head 1, the magnetization direction in free layer 45 is determined according to an external magnetic field, namely, magnetic record in a magnetic recording medium. MR element 4 can read out recorded data from the magnetic recording medium by detecting the magnetization direction. However, as described above, when electrons in a spin-polarized state are injected into free layer 45 and causes magnetization reversal in free layer 45, it becomes difficult to detect an external magnetic field (the magnetism emitted from the magnetic recording medium). As a result, the sensitivity of thin-film magnetic head 1 deteriorates and, at worst, thin-film magnetic head 1 becomes unusable as a reproducing element.

For this reason, it is necessary to inhibit magnetization reversal from occurring in free layer 45 of MR element 4. To that end, it is necessary to reduce the number of such electrons that will be spin-polarized in pinned layer 43, that will pass through spacer layer 44, and that will be injected into free layer 45, in other words, to decrease the current density in free layer 45. Then, the magnetization direction in free layer 45 is not affected by the electrons so much, and magnetization reversal can be prevented. Here, column "IV CONCLUSION" in pp. 184406-6 of "Current-induced Magnetization Dynamics in Current Perpendicular to the Plain Spin Valves" authored by M. Covington et al. will be referred to. According to the document, critical current density, which is a threshold of magnetization reversal, is about $7 \times 10^7$ A/cm$^2$. Accordingly, it is desired to control the current density in free layer 45 to $7 \times 10^7$ A/cm$^2$ or less.

Here, current densities in conventional MR element 104 and MR element 4 according to the present invention were calculated. The result is shown in Table 2. Conventional MR element 104 exemplified here has area (A1) of cap layer 146 in an amount of 55 nm×55 nm=about 0.0030 μm$^2$, and area (A2) of a middle part of spacer layer 144 in an amount of 60 nm×60 nm (=0.06 μm×0.06 μm)=about 0.0036 μm$^2$, similar to the case of the above described example. On the other hand, eleven examples are provided in which MR element 4 has a constricted shape at spacer layer 44 according to the present invention. In all of the examples, width (a2) of the middle part (constricted part) of spacer layer 44 is smaller by 15 nm=0.015 μm than width (a1) of the uppermost part of free layer 45 which is approximately equal to the width of cap layer 46. All of the layers have a square and planar shape such that the width is equal to the length, and are continuous films having no pore formed therein.

TABLE 2

Applied voltage 100 mV
RA value 0.08 Ωμm$^2$

|  | conventional example | The present invention (constricted at spacer layer) | | | | | | | | | | |
|---|---|---|---|---|---|---|---|---|---|---|---|---|
| a1 (μm) | 0.0550 | 0.0350 | 0.0400 | 0.0450 | 0.0500 | 0.0550 | 0.0600 | 0.0650 | 0.0700 | 0.0750 | 0.0800 | 0.0850 |
| a2 (μm) | 0.0600 | 0.0200 | 0.0250 | 0.0300 | 0.0350 | 0.0400 | 0.0450 | 0.0500 | 0.0550 | 0.0600 | 0.0650 | 0.0700 |
| A1 (μm$^2$) | 0.0030 | 0.0012 | 0.0016 | 0.0020 | 0.0025 | 0.0030 | 0.0036 | 0.0042 | 0.0049 | 0.0056 | 0.0064 | 0.0072 |
| A2 (μm$^2$) | 0.0036 | 0.0004 | 0.0006 | 0.0009 | 0.0012 | 0.0016 | 0.0020 | 0.0025 | 0.0030 | 0.0036 | 0.0042 | 0.0049 |
| R (Ω) | 26.4 | 200.0 | 128.0 | 88.9 | 65.3 | 50.0 | 39.5 | 32.0 | 26.4 | 22.2 | 18.9 | 16.3 |
| Is (mA) | 3.78 | 0.50 | 0.78 | 1.13 | 1.53 | 2.00 | 2.53 | 3.13 | 3.78 | 4.50 | 5.28 | 6.13 |
| J1 (A/cm$^2$) | $1.3 \times 10^8$ | $4.1 \times 10^7$ | $4.9 \times 10^7$ | $5.6 \times 10^7$ | $6.1 \times 10^7$ | $6.6 \times 10^7$ | $7.0 \times 10^7$ | $7.4 \times 10^7$ | $7.7 \times 10^7$ | $8.0 \times 10^7$ | $8.3 \times 10^7$ | $8.5 \times 10^7$ |

TABLE 2-continued

Applied voltage 100 mV
RA value 0.08 Ωμm²

| | conventional example | The present invention (constricted at spacer layer) | | | | | | | | | | |
|---|---|---|---|---|---|---|---|---|---|---|---|---|
| J2 (A/cm²) | 1.1 × 10⁸ | 1.3 × 10⁸ | 1.3 × 10⁸ | 1.3 × 10⁸ | 1.3 × 10⁸ | 1.3 × 10⁸ | 1.3 × 10⁸ | 1.3 × 10⁸ | 1.3 × 10⁸ | 1.3 × 10⁸ | 1.3 × 10⁸ | 1.3 × 10⁸ |
| a1/a2 | 0.92 | 1.75 | 1.60 | 1.50 | 1.43 | 1.38 | 1.33 | 1.30 | 1.27 | 1.25 | 1.23 | 1.22 |
| A1/A2 | 0.84 | 3.06 | 2.56 | 2.25 | 2.04 | 1.89 | 1.78 | 1.69 | 1.62 | 1.56 | 1.52 | 1.47 |

Table 2 shows widths (a1) of the uppermost parts of free layers 45 and 145, widths (a2) in the middle parts of spacer layers 44 and 144, areas (A1) (=a1²) of the uppermost parts of free layers 45 and 145, areas (A2) (=a2²) in the (=a1²) of the uppermost parts of free layers 45 and 145, areas (A2) (=a2²) in the middle parts of spacer layers 44 and 144, resistance (R), electric current (Is), current densities (J1) in free layers 45 and 145, and current densities (J2) in spacer layers 44 and 144, when an applied voltage of 100 mV is applied to MR elements 4 and 104 and when the sheet resistances value (RA) of the MR elements 4 and 104 is 0.08. Resistance (R) is calculated by dividing value (RA) of 0.08 by smaller value of area (A1) and area (A2). Specifically, in the conventional example, resistance (R) is determined by dividing value (RA) of 0.08 by area (A1) in the uppermost part of free layer 145, which has the smallest area in MR element 104 (and which is approximately equal to the area of cap layer 146). In the case of the present invention, resistance (R) is determined by dividing value (RA) of 0.08 by area (A2) in the middle part of spacer layer 44, which has the smallest area in MR element 4. In addition, electric current (Is) is determined by dividing the applied voltage of 100 mV by resistance (R). Current densities (J1) in free layers 45 and 145 are determined by dividing electric current (Is) by areas (A1) in the uppermost parts of free layers 45 and 145. Current densities (J2) in spacer layers 44 and 144 are determined by dividing electric current (Is) by areas (A2) in the middle parts of spacer layers 44 and 144. Furthermore, Table 2 shows the width ratio (a1)/(a2) between free layers 45, 145 and spacer layers 44, 144, and shows area ratio (A1)/(A2) between free layers 45, 145 and spacer layers 44, 144.

It is understood from the Table 2 that current density (J1) in free layer 45 according to the present invention, is greatly reduced in comparison with that in the conventional example. Specifically, the conventional example shows current density (J1) in free layer 145 in an amount of 1.3×10⁸ A/cm², which means that free layer 145 is easily affected by spin torque and may cause magnetization reversal therein. In contrast to this, examples according to the present invention, can reduce the effect of the above described spin torque. As shown in Table 2, when free layer 45 has, in particular, the width of 60 nm=0.06 μm or smaller, the current density in free layer 45 becomes a critical current density of 7×10⁷ A/cm² or lower which is a value described in "Current-induced Magnetization Dynamics in Current Perpendicular to the Plain Spin Valves", and free layer 45 can prevent magnetization reversal from occurring therein. When the width of free layer 45 is smaller, the width of spacer layer 44 consequently becomes smaller, and free layer 45 more reliably prevents magnetization reversal.

On the other hand, current density (J2) in a middle part of spacer layer 44 in each example according to the present invention is about 1.3×10⁸ A/cm² which is higher than current density (J2) in a middle part of spacer layer 144 of a conventional example. This is effective for increasing the amount (dR) of resistance change in an MR element and consequently for improving the sensitivity of an MR element.

Table 2 shows various characteristics of MR element 4 which is manufactured by a method according to the present invention comprising two steps of milling layers in the element at different angles, as will be described later, in which the width (a2) of a middle part in spacer layer 44 is smaller than the width (a1) of the uppermost part in free layer 45 by 15 nm=0.015 μm, as described above. On the other hand, Table 3 shows an example of MR element 4 which is manufactured in a different milling condition from that in Table 2, and in which the width (a2) of the middle part in spacer layer 44 is smaller than the width (a1) of the uppermost part in free layer 45 by 10 nm=0.010 μm. Furthermore, Table 4 shows the example of MR element 4 in which the width (a2) of the middle part in spacer layer 44 is smaller than the width (a1) of the uppermost part in free layer 45 by 20 nm=0.020 μm.

TABLE 3

Applied voltage 100 mV
RA value 0.08 Ωμm²

| a1 (μm) | 0.0350 | 0.0400 | 0.0450 | 0.0500 | 0.0550 | 0.0600 | 0.0650 | 0.0700 | 0.0750 | 0.0800 | 0.0850 |
|---|---|---|---|---|---|---|---|---|---|---|---|
| a2 (μm) | 0.0250 | 0.0300 | 0.0350 | 0.0400 | 0.0450 | 0.0500 | 0.0550 | 0.0600 | 0.0650 | 0.0700 | 0.0750 |
| A1 (μm²) | 0.0013 | 0.0016 | 0.0020 | 0.0025 | 0.0030 | 0.0036 | 0.0042 | 0.0049 | 0.0056 | 0.0064 | 0.0072 |
| A2 (μm²) | 0.0006 | 0.0009 | 0.0012 | 0.0016 | 0.0020 | 0.0025 | 0.0030 | 0.0036 | 0.0042 | 0.0049 | 0.0056 |
| R (Ω) | 128.0 | 88.9 | 65.3 | 50.0 | 39.5 | 32.0 | 26.4 | 22.2 | 18.9 | 16.3 | 14.2 |
| Is (mA) | 0.78 | 1.13 | 1.53 | 2.00 | 2.53 | 3.13 | 3.78 | 4.50 | 5.28 | 6.13 | 7.03 |
| J1 (A/cm²) | 6.4 × 10⁷ | 7.0 × 10⁷ | 7.6 × 10⁷ | 8.0 × 10⁷ | 8.4 × 10⁷ | 8.7 × 10⁷ | 9.0 × 10⁷ | 9.2 × 10⁷ | 9.4 × 10⁷ | 9.6 × 10⁷ | 9.7 × 10⁷ |

TABLE 3-continued

Applied voltage 100 mV
RA value 0.08 Ωμm²

| J2 (A/cm²) | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ |
|---|---|---|---|---|---|---|---|---|---|---|---|
| a1/a2 | 1.40 | 1.33 | 1.29 | 1.25 | 1.22 | 1.20 | 1.18 | 1.17 | 1.15 | 1.14 | 1.13 |
| A1/A2 | 1.96 | 1.78 | 1.65 | 1.56 | 1.49 | 1.44 | 1.40 | 1.36 | 1.33 | 1.31 | 1.28 |

TABLE 4

Applied voltage 100 mV
RA value 0.08 Ωμm²

| a1 (μm) | 0.0350 | 0.0400 | 0.0450 | 0.0500 | 0.0550 | 0.0600 | 0.0650 | 0.0700 | 0.0750 | 0.0800 | 0.0850 |
|---|---|---|---|---|---|---|---|---|---|---|---|
| a2 (μm) | 0.0150 | 0.0200 | 0.0250 | 0.0300 | 0.0350 | 0.0400 | 0.0450 | 0.0500 | 0.0550 | 0.0600 | 0.0650 |
| A1 (μm²) | 0.0012 | 0.0016 | 0.0020 | 0.0025 | 0.0030 | 0.0036 | 0.0042 | 0.0049 | 0.0056 | 0.0064 | 0.0072 |
| A2 (μm²) | 0.0002 | 0.0004 | 0.0006 | 0.0009 | 0.0012 | 0.0016 | 0.0020 | 0.0025 | 0.0030 | 0.0036 | 0.0042 |
| R (Ω) | 355.6 | 200.0 | 128.0 | 88.9 | 65.3 | 50.0 | 39.5 | 32.0 | 26.4 | 22.2 | 18.9 |
| Is (mA) | 0.28 | 0.50 | 0.78 | 1.13 | 1.53 | 2.00 | 2.53 | 3.13 | 3.78 | 4.50 | 5.28 |
| J1 (A/cm²) | $2.3 \times 10^7$ | $3.1 \times 10^7$ | $3.9 \times 10^7$ | $4.5 \times 10^7$ | $5.1 \times 10^7$ | $5.6 \times 10^7$ | $6.0 \times 10^7$ | $6.4 \times 10^7$ | $6.7 \times 10^7$ | $7.0 \times 10^7$ | $7.3 \times 10^7$ |
| J2 (A/cm²) | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ | $1.3 \times 10^8$ |
| a1/a2 | 2.33 | 2.00 | 1.80 | 1.67 | 1.57 | 1.50 | 1.44 | 1.40 | 1.36 | 1.33 | 1.31 |
| A1/A2 | 5.44 | 4.00 | 3.24 | 2.78 | 2.47 | 2.25 | 2.09 | 1.96 | 1.86 | 1.78 | 1.71 |

It is understood from table 3 that when the width of free layer 45 is 0.04 μm or smaller and when the width of spacer layer 44 is 0.03 μm or smaller, current density (J1) in free layer 45 becomes the critical current density of $7 \times 10^7$ A/cm² or lower which is the value described in "Current-Induced Magnetization Dynamics in Current Perpendicular to the Plain Spin Valves", and free layer 45 can prevent magnetization reversal from occurring therein. On the other hand, it is understood from table 4 that when the width of free layer 45 is 0.08 μm or smaller and when the width of spacer layer 44 is 0.06 μm or smaller, the current density (J2) in the middle part of spacer layer becomes the critical current density of $7 \times 10^7$ A/cm² or lower, and free layer 45 can prevent magnetization reversal from occurring therein. Thus, the smaller the size of a constricted part in spacer layer 44, the larger can be the width of free layer 45 for preventing magnetization reversal from occurring therein. When spacer layer 44 is not so much constricted, free layer 45 needs to have a quite small width in order to prevent the magnetization reversal from occurring therein. Referring to Tables 1 to 3, it is understood that when the ratio (a1)/(a2) of the widths of free layers 45 to those of spacer layers 44 is 1.33 or more, in other words, when area ratio (A1)/(A2) is 1.77 or more in MR elements having various dimensions, current density (J1) in free layer 45 becomes the critical current density of $7 \times 10^7$ A/cm² or less, and free layer 45 can prevent magnetization reversal from occurring therein. Because it was considered that the width ratio and the area ratio in Tables 1 to 3 were rounded off to the second decimal place in Tables 1 to 3, the preferable width ratio (a1)/(a2) of free layer 45 to spacer layer 44 was determined to be 1.33 or more, and the preferable area ratio (A1)/(A2) was determined to be 1.77 or more as described above.

In addition, when (A1) is larger than (A2), (J) is determined by (Is)/(A1)=[(applied voltage)/(R)]/(A1)={(applied voltage)/[(RA)/(A2)]}/(A1)=[(applied voltage)/(RA)]×[(A2)/(A1)]. Accordingly, it is preferable that (A2) and (A1) satisfy the relationship of (A2)/(A1)≦$7 \times 10^7$×[(RA)/(applied voltage)], or (A1)/(A2)≧(applied voltage)/[($7 \times 10^7$×(RA)], in order to make (J1) satisfy the relationship of (J1)≦$7 \times 10^7$ A/cm² while considering variations of both the applied voltage and the value (RA). When substituting a specific value into the expressions, it goes without saying that units need to be unified, though this is not described in detail.

In general, when a constant voltage is applied, an electric current decreases due to the increase of resistance, but when the resistance increases due to the decrease of the area of an element, the current density does not change. However, when resistance is increased by a current-confined layer (for example, spacer layer 44 that has a constricted shape in the present embodiment), the resistance value depends on the characteristics of current-confined layer, so that the current densities in layers other than the current-confined layer (such as free layer 45) are decreased. The MR element in the present embodiment can acquire a large amount of resistance change while decreasing its current density in such a manner, and accordingly can reduce the effect of spin torque.

[Method for Manufacturing MR Element]

Next, a method for manufacturing MR element 4 according to the present invention will be described. The manufacturing method is characterized by forming MR element 4 into a constricted shape at spacer layer 44.

The manufacturing method includes the step of forming stacked layers of sequentially buffer layer 41, antiferromagnetic layer 42, outer layer 43a, nonmagnetic intermediate layer 43b, inner layer 43c, spacer layer 44, free layer 45, and cap layer 46, on lower shield layer 13. The step of forming the stacked layers can be carried out by using a film-forming process such as a sputtering process, as in the case of manufacturing a conventional MR element. An example of the material and the thickness of respective layers is shown in the above described Table 1. After respectively stacked layers 41 to 46 of MR element 4 are formed on lower shield layer 13 in such a manner, resist 10 is formed thereon and is patterned (see FIG. 4A). Then, MR element 4 is formed into a pillar shape by milling the above layers while using resist 10 as a mask. In the present embodiment, the milling process is performed by two steps that are separate. In the first milling step, the layers are milled at an angle between zero degrees and 15 degrees with respect to a vertical direction (stacked direction). At this time, the milling operation is finished before the milled depth will reach a desired value, in other words, before pillar-shaped MR element 4 will acquire the desired width. In the first milling step, a side of MR element 4 is milled at an almost vertical angle, accordingly the side of MR element 4 is inclined a little and does not have unevenness formed thereon (see FIG. 4B). Alternatively, the milling operation in the first milling step may be stopped when the milled depth reaches an interface between buffer layer 41 and antiferromagnetic layer 42, as will be described later.

In the next step, the side of MR element 4 is again milled at an angle of 60 degrees or more with respect to the stacked direction (see FIG. 4C) while leaving resist 10 as a mask. In the second milling step, pillar-shaped MR element 4 is slimmed, namely, thinned. At this time, the side of MR element 4 is milled at a large angle with respect to the stacked direction. Accordingly the side of MR element 4 acquires a large inclination, and simultaneously the respective layers are milled to different depths according to the milling rate of materials for the respective layers. Specifically, when the milling rate of Cu, which makes up spacer layer 44, is supposed to be 1, the milling rate of CoFe, which makes up free layer 45, outer layer 43a, and inner layer 43c of pinned layer 43, is 0.53, and the milling rate of Ru, which makes up cap layer 46 and nonmagnetic intermediate layer 43b of pinned layer 43, is 0.5, as shown in Table 5. Thus, as the milling rate of CoFe is close to that of Ru, the milled quantity in free layer 45 is not so much different from that in pinned layer 43. However, because the milling rate of Cu is as large as about twice those of CoFe and Ru, a constricted shape at spacer layer 44 which is made from Cu is naturally formed (see FIG. 4D). After the first and second milling steps have been finished, resist 10 is removed. Thus, MR element 4 is completed which is shown in FIG. 3.

TABLE 5

|  | milling rate (relative value) |
|---|---|
| Ru | 0.5 |
| CoFe | 0.53 |
| Cu | 1.0 |
| Au | 1.2 |
| Ag | 1.2 |

In addition, even when spacer layer 44 is formed from Au or Ag instead of Cu, spacer layer 44 can be formed into the constricted shape by the two milling steps similar to the above described case, because the milling rates of Au and Ag are large as shown in Table 5.

Milling steps will be further explained. If the layers are milled at a larger angle with respect to a stacked direction in the first milling step, a large inclination is formed on the side of MR element 4, and then, it becomes difficult in the second milling step to form a constricted shape at spacer layer 44. In order to easily form the constricted shape, it is preferable to mill the side of MR element 4 at an angle as vertical as possible in the first milling step so that the side of MR element is approximately upright; and it is also preferable to slim MR element 4 in the second milling step by milling the side of MR element at an angle as large as possible with respect to the stacked direction.

After the first and second milling steps have been finished, insulation film 47 for securing insulative properties of the side of MR element is formed on both sides of MR element 4. MR element 4 according to the present embodiment has a side that is inclined and that has a constricted shape at spacer layer 44, whose structure is different from that of a conventional MR element. Accordingly, it is preferable to form insulation film 47 by using such a material and such a condition under which film is formed that film can be easily formed inside a constricted part. Insulation film 47 can be formed on the side of MR element at a comparatively large angle (for instance, 40 degrees with respect to a vertical direction) by using an ion-beam sputtering technique for instance. Insulation layer 47 can also be formed by using a low-temperature CVD (Chemical Vapor Deposition) method as well so that it can reliably enter the constricted part. In this case, however, liftoff properties of resist 10 are aggravated. It is preferable to keep the side surface of MR element smooth by a CMP (Chemical Mechanical Polishing) method. After insulation film 47 has been thus formed, hard bias film 48 is formed thereon, and first upper shield layer 15 is further formed.

Figure 5:
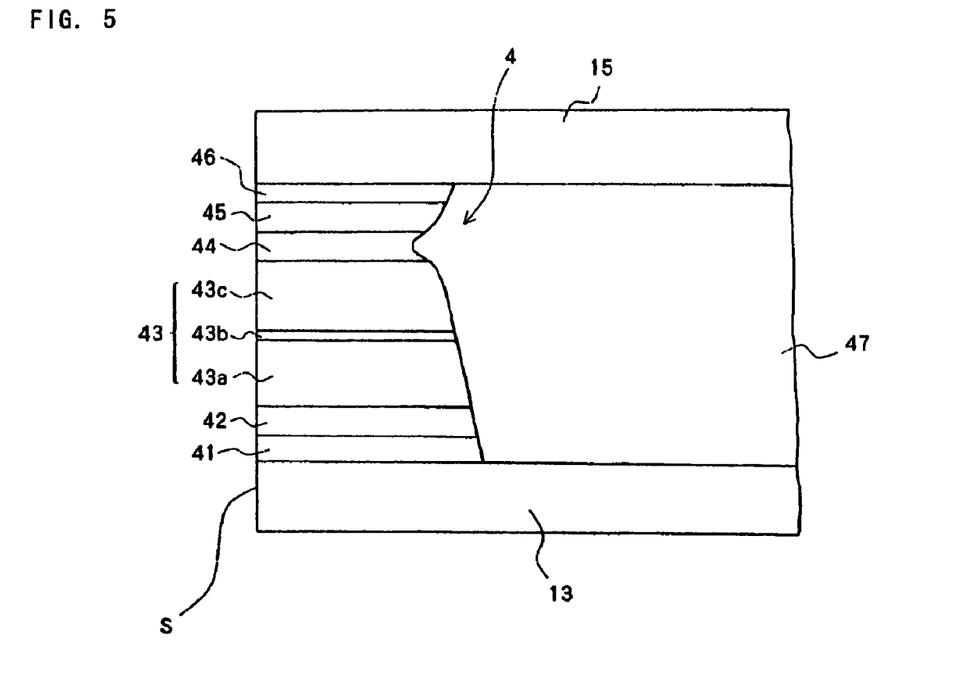
FIG. 5 shows the MR element shown in FIG. 3 when viewed from a direction perpendicular to the surface to face a recording medium.

In the above description, the side of MR element was explained about the shape when viewed from a surface (S) of MR element 4 to face a recording medium, which is shown in FIG. 2. However, the surface of an opposite side of surface (S) of MR element 4 to face a recording medium (the surface of the right side in FIGS. 2 and 5) may be formed by using two milling steps similar to the above described case so as to have the constricted shape at spacer layer 44 as shown in FIG. 5. MR element 4 has a quadratic prism shape in which four side surfaces extend in an upright direction (stacked direction), and at least one of three side surfaces other than surface (S) to face a recording medium, is formed into a constricted shape at spacer layer 44. However, surface (S) to face a recording medium must have a flat shape free from unevenness, because the MR element is used in a thin-film magnetic head 1.

SPECIFIC EXAMPLE

Figure 4A:
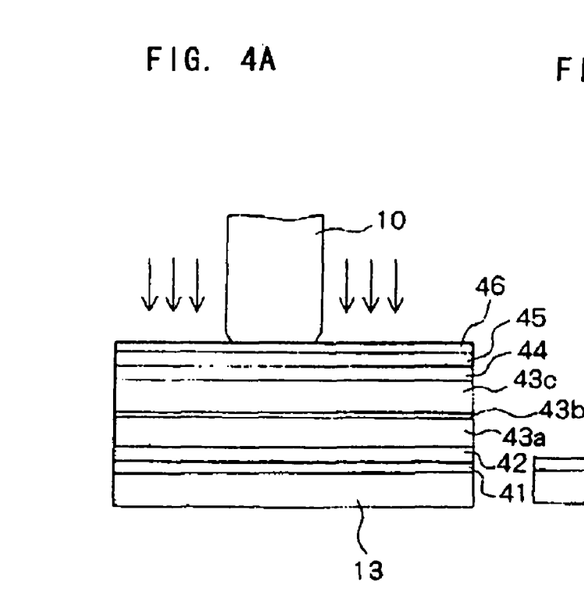
FIGS. 4A to 4D are explanatory drawings sequentially showing the method of manufacturing the MR element shown in FIG. 3.
Figure 4B:
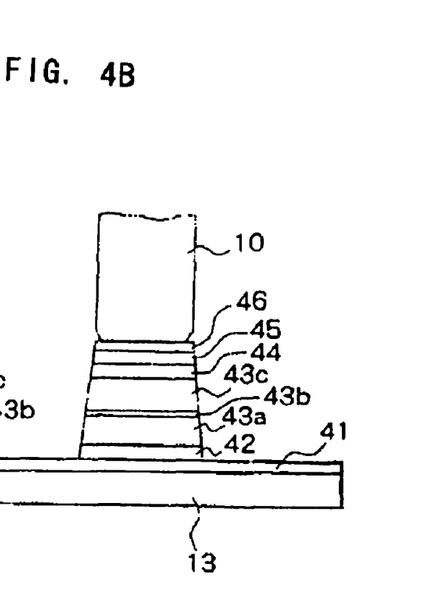

The above described method for manufacturing MR element 4 will be now described with reference to a specific example. However, only the first and second milling steps which are the main features of the present invention will be described, In the present example, stacked body having the configuration shown in Table 1 was formed from buffer layer 41 to cap layer 46, and a first milling step was carried out and stopped at the interface between buffer layer 41 and antiferromagnetic layer 42, as shown in FIG. 4A. In the first milling step, the milling angle was 5 degrees with respect to the stacked direction of the layers. In this stage, MR element 4 had a pillar shape with a top end (cap layer 46) having a width of 75 nm and a bottom end (buffer layer 41) having a width of 85 nm. At this time, spacer layer 44 had a width of about 80 nm (see FIG. 4B).

Figure 4C:
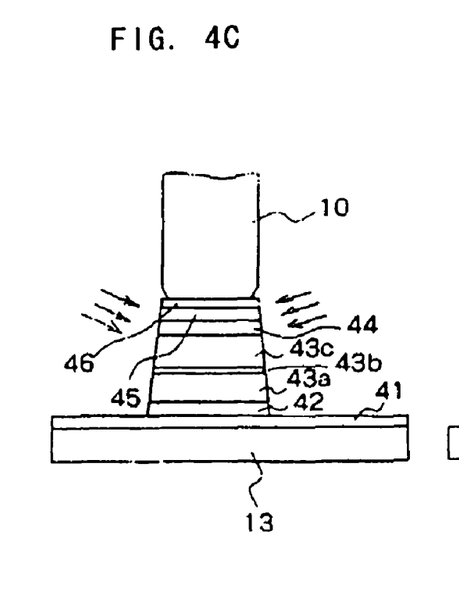
Figure 4D:
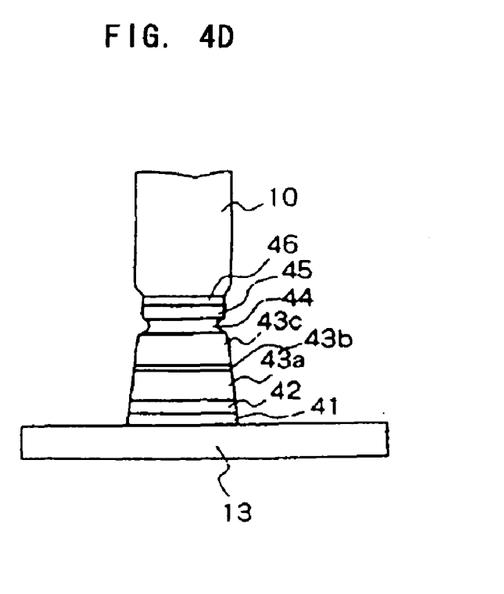

Subsequently, the side of MR element 4 was milled so that one side of spacer layer 44 is thinned (slimmed) by 20 nm in a second milling step, as shown in FIG. 4C. At this time, the milling angle was 65 degrees with respect to the stacked direction of the layers. As a result, one side of spacer layer 44 was slimmed by about 20 nm, and simultaneously one side of the top end and the bottom end of MR element 4 were each slimmed by about 10 nm (see FIG. 4D). At this time, free layer 45 of the MR element 4 had a width of about 55 nm at the top part, pinned layer 43 had a width of about 60 nm at the bottom part, and spacer layer 44 had a width of about 40 nm. The results do not show that these widths precisely match the proportional value to the milling rate shown in Table 5. The reason is considered to be because an actual milling rate is affected by an adjacent layer.

In the configuration that is eventually obtained, the central part of spacer layer 44 had a width of about 70% of that in the central part of the free layer 45. In the present example, the surface of an opposite side of surface (S) to face a recording medium, of MR element 4 (the surface of right side in FIGS. 2 and 5) was formed into a constricted shape at spacer layer 44 as shown in FIG. 5, by using two milling steps similar to the above described case. However, surface (S) to face a recording medium was polished into a flat shape. In the present embodiment, the amount of the surface that was milled in the opposite side of surface (S) to face a recording medium (the surface of right side in FIGS. 2 and 5) of MR element 4 was increased so that free layer 45 has a width of about 55 nm at the top part and spacer layer 44 has a width of about 40 nm, even in a direction perpendicular to surface (S) to face a recording medium (lateral direction in FIGS. 2 and 5). In addition, an area in a central part of the spacer layer was controlled to become about half (to be precise, 0.7×0.7=0.49) of the area in the top part of the free layer. As a matter of course, it is possible to appropriately adjust the area ratio by changing the milling amount.

[Head Gimbal Assembly and Hard-disk Drive which Include Thin-film Magnetic Head]

Figure 6:
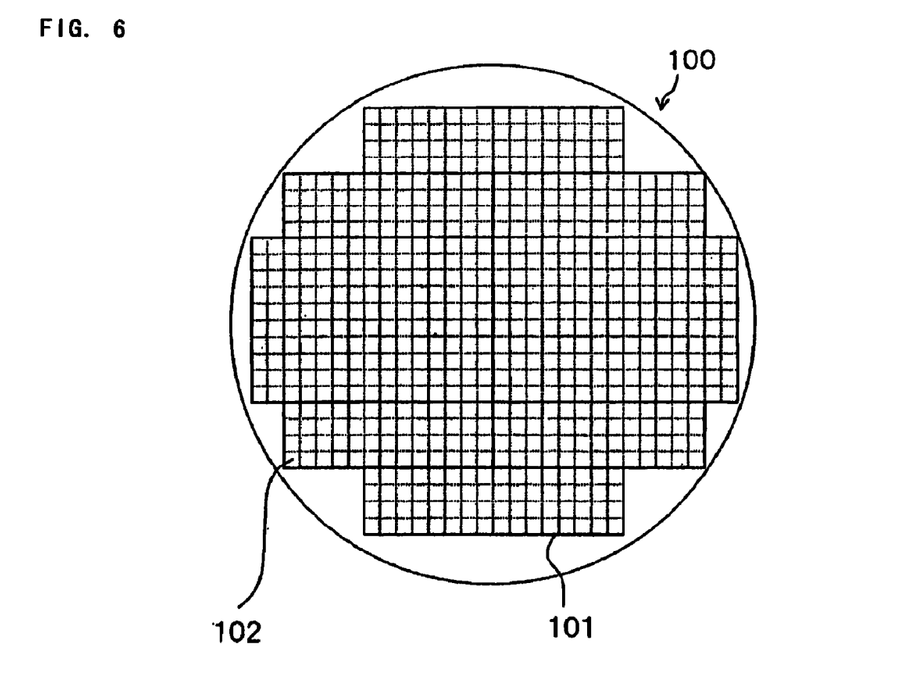
FIG. 6 is a plan view of an example of a wafer having the thin-film magnetic head shown in FIG. 2 formed thereon.

Many thin-film magnetic heads 1 according to the present invention are arranged on one wafer. FIG. 6 shows a diagrammatic plan view of the wafer having many structures (substrates) that includes the thin-film magnetic head shown in FIG. 2 thereon.

Wafer 100 is sectioned into a plurality of head element aggregates 101. Head element aggregate 101 includes a plurality of head elements 102, and is a work unit in the step of polishing surface (S) to face a recording medium of thin-film magnetic head 1 (see FIG. 2). Dicing portions (not shown) are provided between head element aggregates 101 and also provided between head elements 102. Head element 102 is a structure (substrate) that includes a configuration of thin-film magnetic head 1, and becomes thin-film magnetic head 1 after having been subjected to necessary working steps such as polishing to form surface (S) to face a recording medium. This polishing step is carried out generally on a plurality of head elements 102 which has been cut out into a row.

Figure 7:
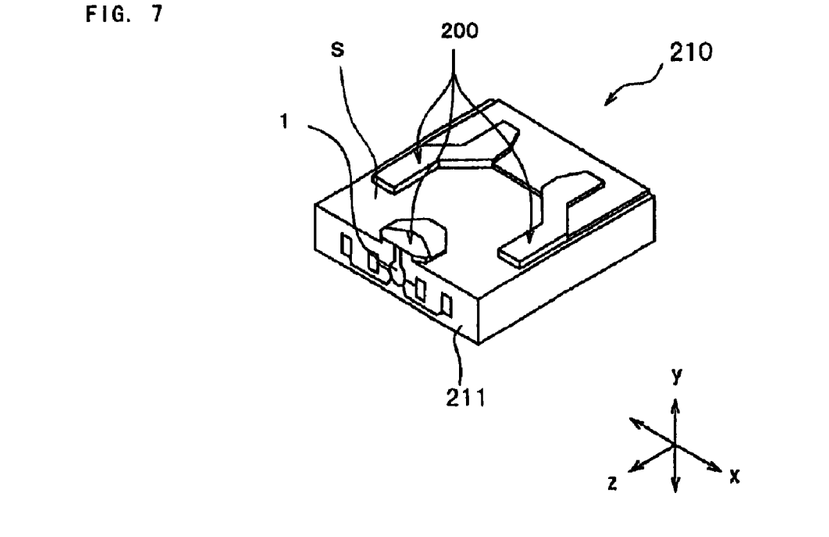
FIG. 7 is a perspective view of an example of a slider including the thin-film magnetic head shown in FIG. 2.
Figure 8:
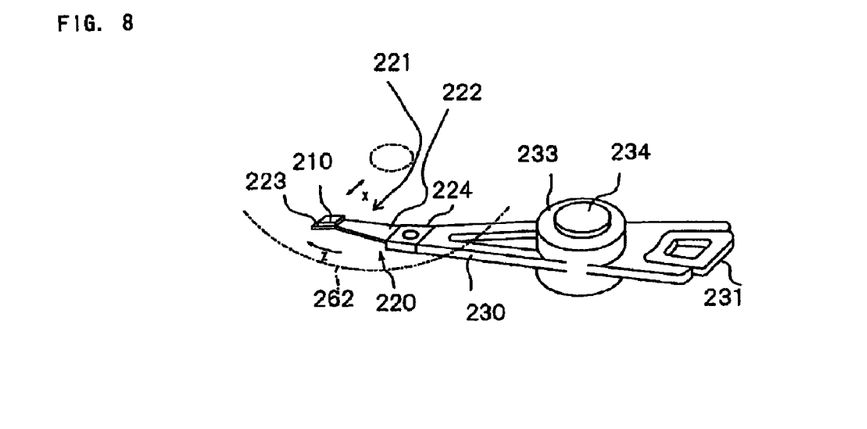
FIG. 8 is a perspective view of a head gimbal assembly including the slider shown in FIG. 7.

Explanation next regards a head gimbal assembly and a hard disk drive that comprise the thin-film magnetic head of this invention. Referring to FIG. 7, slider 210 which is included in the head gimbal assembly will be described first. In a hard disk drive, slider 210 is arranged opposite to a hard disk, which is a rotationally-driven disc-shaped recording medium. Slider 210 has a thin-film magnetic head 1 obtained from head element 102 (see FIG. 6), and has a substantially hexahedral shape in which surface (S) to face a recording medium is formed into an air bearing surface 200 which is positioned opposite to the hard disk. When the hard disk rotates in the z direction shown in FIG. 7, airflow which passes between the hard disk and slider 210 creates a dynamic lift, which is applied to slider 210 downward in the y direction. Slider 210 is configured to lift up from the surface of the hard disk because of this dynamic lift effect. X direction in FIG. 8 is a transverse direction with regard to track of the hard disk. At the end surface 211 on the outlet side of the airflow of slider 210, electrode pads for input or output of signal to/from reproducing section 2 and recording section 3 (see FIG. 2). Surface 211 is the upper end portion in FIG. 2.

Referring to FIG. 8, head gimbal assembly 220 will be explained next. Head gimbal assembly 220 is provided with slider 210 and suspension 221 for resiliently supporting slider 210. Suspension 221 has load beam 222 in the shape of a flat spring and made of, for example, stainless steel; flexure 223 attached to one end of load beam 222, and to which slider 210 is fixed, while providing an appropriate degree of freedom to slider 210; and base plate 224 provided on the other end of load beam 222. Base plate 224 is adapted to be attached to arm 230 of an actuator for moving slider 210 in x direction which is transverse direction with regard to track of hard disk 262. The actuator has arm 203 and a voice coil motor to drive arm 230. The portion of flexure 223 to which slider 210 is attached has a gimbal section for maintaining slider 210 in a fixed orientation.

Head gimbal assembly 220 is attached to arm 230 of the actuator. The arrangement in which a head gimbal assembly 220 is attached to a single arm 230 is called a head arm assembly. The arrangement in which head gimbal assemblies 220 are attached to the respective arm of a carriage having a plurality of arms is called a head stack assembly.

FIG. 8 shows an example of a head arm assembly. In head arm assembly, head gimbal assembly 220 is attached to one end of arm 230. Coil 231, which constitutes a part of a voice coil motor, is attached to the other end of arm 230. In the intermediate portion of arm 230, bearing section 233 which is attached to shaft 234 for rotatably supporting arm 230 is provided.

Figure 9:
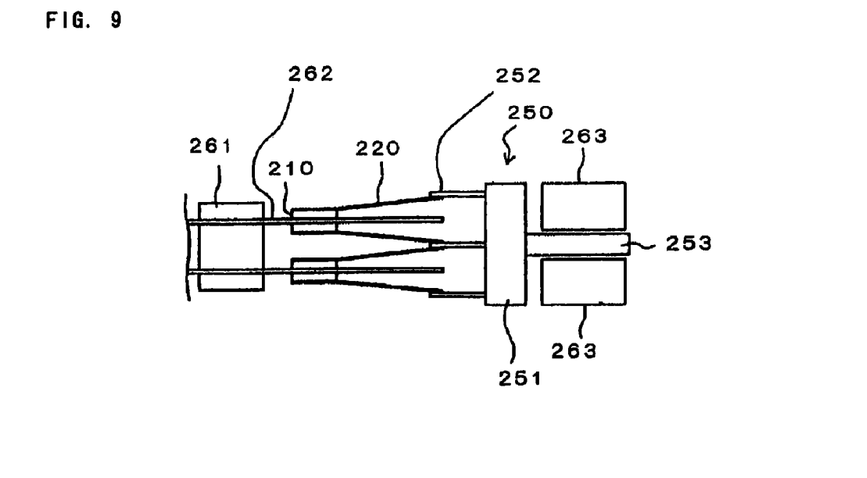
FIG. 9 is a side view of a main part of a hard-disk drive including the head gimbal assembly shown in FIG. 8.
Figure 10:
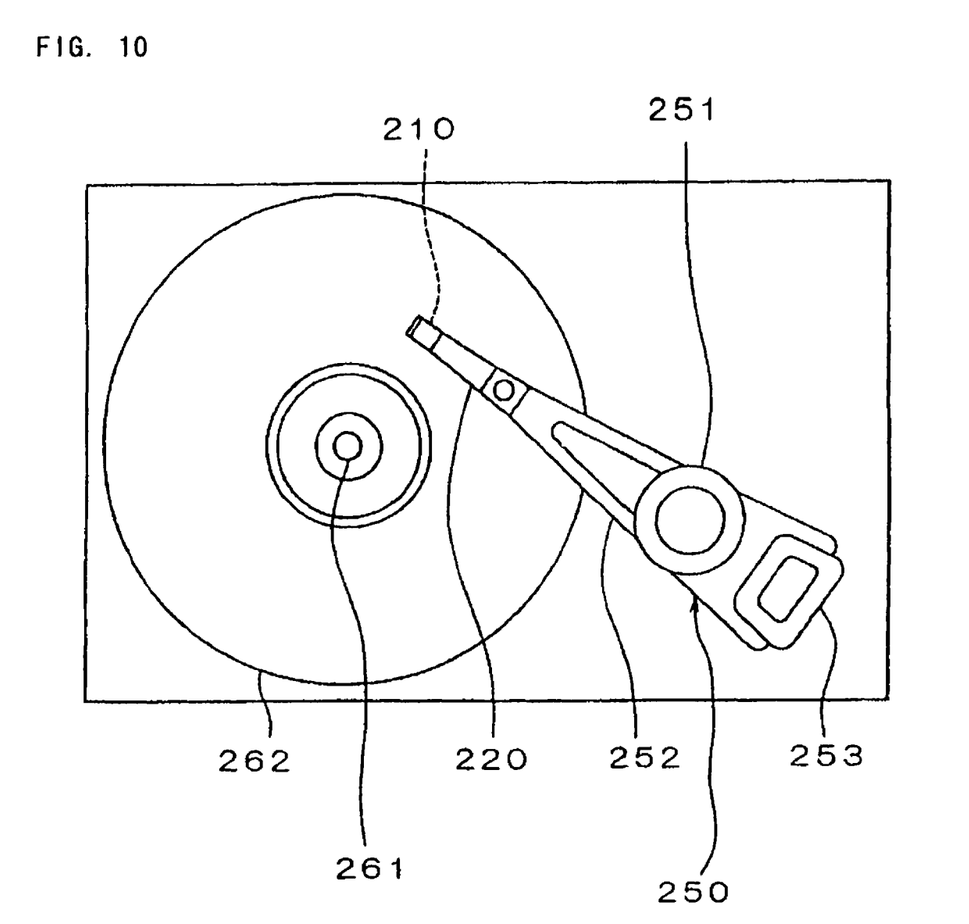
FIG. 10 is a plan view of the hard-disk drive including the head gimbal assembly shown in FIG. 8.

Referring to FIG. 9 and FIG. 10, examples of a head stack assembly and a hard disk drive will be explained next. FIG. 9 is an explanatory diagram illustrating an essential part of a hard disk drive, and FIG. 10 is a plan view of the hard disk drive. Head stack assembly 250 has carriage 251 provided with a plurality of arms 252. A plurality of head gimbal assemblies 220 are attached to a plurality of arms 252 such that head gimbal assemblies 220 are arranged apart from each other in the vertical direction. Coil 253, which constitutes a part of the voice coil motor, is attached to carriage 251 on the side opposite to arms 252. Head stack assembly 250 is installed in a hard disk drive. The hard disk drive has a plurality of hard disks (magnetic recording medium) connected to spindle motor 261. Two sliders 210 are arranged per each hard disk 262 at positions opposite to each other interposing hard disk 262 therebetween. The voice coil motor has permanent magnets 263 which are arranged in positions opposite to each other interposing coil 253 of head stack assembly 250 therebetween.

Head stack assembly 250 and the actuator, except for sliders 210, carry sliders 210 and position sliders 210 relative to hard disks 262.

In the hard disk drive, sliders 210 are moved in the transverse direction with regard to the tracks of hard disks 262, and positioned relative to hard disks 262, by the actuator. Thin-film magnetic head 1 that is contained in slider 210 records information to hard disk 262 using recording section 3 and reads information recorded in hard disk 262 using reproducing section 2.

Thin-film magnetic head 1 is not limited to the above described embodiment, but can be variously changed. In the above described embodiment, thin-film magnetic head 1 has a structure in which MR element 4 that is used for reading information on the substrate 11 side, and an induction-type electromagnetic conversion element that is used for writing is stacked thereon. However, for instance, the stacking order may be reversed. In addition, in the above described embodiment, thin-film magnetic head 1 which has both MR element 4 and an induction-type electromagnetic conversion element is used, but thin-film magnetic head 1 may have only MR element 4.

Although a certain preferred embodiment of the present invention has been shown and described in detail, it should be understood that various changes and modifications may be made without departing from the spirit or scope of the appended claims.

What is claimed is:

1. A magneto-resistance effect element comprising a stacked body which comprises a pinned layer having a fixed magnetization direction, a free layer having a magnetization direction that varies according to an external magnetic field, and a nonmagnetic spacer layer which is interposed between said pinned layer and said free layer,
    said stacked body having a constricted shape in which at least one part of said spacer layer is constricted when viewed from at least one direction perpendicular to a stacked direction of said stacked body,
    wherein the smallest cross-section area of said spacer layer is smaller than the smallest cross-section area of said pinned layer and smaller than the smallest cross-section area of said free layer when viewed from said stacked direction, and
    $A1/A2 \geq$ applied voltage/($7 \times 10^7$[A/cm$^2$]×sheet resistance),
    where A1 is the largest cross-section area of said free layer when viewed from said stacked direction, and A2 is the smallest cross-section area of said spacer layer when viewed from said stacked direction.

2. The magneto-resistance effect element according to claim 1, wherein said spacer layer is constricted with respect to said pinned layer and said free layer.

3. The magneto-resistance effect element according to claim 1, wherein said spacer layer is fainted into a constricted shape centered in the narrowest portion when viewed from said at least one direction perpendicular to said stacked direction.

4. The magneto-resistance effect element according to claim 1, wherein the smallest width of said spacer layer is smaller than the smallest width of said pinned layer and smaller than the smallest width of said free layer when viewed from said at least one direction perpendicular to said stacked direction.

5. The magneto-resistance effect element according to claim 4, wherein the largest width of said free layer is 1.33 or more times larger than the smallest width of said spacer layer when viewed from said at least one direction perpendicular to said stacked direction.

6. The magneto-resistance effect element according to claim 4, wherein the largest width of said free layer is 60 nm or less when viewed from said at least one direction perpendicular to said stacked direction.

7. The magneto-resistance effect element according to claim 1, wherein the largest cross-section area of said free layer is 1.77 or more times larger than the smallest cross-section area of said spacer layer when viewed from said stacked direction.

8. The magneto-resistance effect element according to claim 1, wherein said spacer layer is a continuous film having no pore formed therein.

9. A thin-film magnetic head comprising said magneto-resistance effect element according to claim 1.

10. A substrate comprising said thin-film magnetic head according to claim 9.

11. A wafer which is used for manufacturing said substrate according to claim 10, said wafer being provided with at least one of said one thin-film magnetic head.

12. A head gimbal assembly comprising:
    a slider which has said substrate according to claim 10, said slider being arranged opposite to a recording medium; and
    a suspension for resiliently supporting said slider.

13. A hard disk drive comprising:
    a slider which has said substrate according to claim 10, said slider being arranged opposite to a disc-shaped recording medium that is rotatably driven; and
    a positioning device for supporting said slider and for positioning said slider relative to said recording medium.

* * * * *